United States Patent
Gupta et al.

(10) Patent No.: US 7,642,529 B2
(45) Date of Patent: Jan. 5, 2010

(54) METHOD OF DETERMINING ANGLE MISALIGNMENT IN BEAM LINE ION IMPLANTERS

(75) Inventors: Atul Gupta, Beverly, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 251 days.

(21) Appl. No.: 11/541,373

(22) Filed: Sep. 29, 2006

(65) Prior Publication Data

US 2008/0096359 A1    Apr. 24, 2008

(51) Int. Cl.
    *H01J 37/317*  (2006.01)
(52) U.S. Cl. ................................... 250/492.21
(58) Field of Classification Search .............. 250/492.21
    See application file for complete search history.

(56) References Cited

U.S. PATENT DOCUMENTS

| 6,555,832 B1 * | 4/2003 | Ryding et al. .......... 250/492.21 |
| 7,227,159 B2 * | 6/2007 | Shibata et al. .......... 250/492.21 |
| 7,329,882 B2 * | 2/2008 | Rathmell et al. ....... 250/492.21 |

* cited by examiner

*Primary Examiner*—Jack I Berman

(57) ABSTRACT

A method includes directing an ion beam at a plurality of differing incident angles with respect to a target surface of a substrate to implant ions into a plurality of portions of the substrate, wherein each one of the plurality of differing incident angles is associated with a different one of the plurality of portions, measuring angle sensitive data from each of the plurality of portions of the substrate, and determining an angle misalignment between the target surface and the ion beam incident on the target surface from the angle sensitive data. A method of determining a substrate miscut is also provided.

4 Claims, 11 Drawing Sheets

METHOD OF DETERMINING ANGLE MISALIGNMENT IN BEAM LINE ION IMPLANTERS

FIELD

This disclosure relates to beam line ion implanters and, more particularly, to a method of determining angle misalignment in beam line ion implanters.

BACKGROUND

A beam line ion implanter generates a well defined ion beam and directs the ion beam at a target surface of a substrate. The ion beam may strike the target surface of the substrate at any incident angle of the ion beam relative to the target surface to implant energetic ions of the ion beam into the substrate. A desired incident angle may be specified before an implant and any deviation from the desired incident angle can significantly impact the results of the implant.

An angle misalignment between the target surface of the substrate and the incident ion beam may be caused by several mechanisms and may lead to deviation from the desired incident angle. For example, the angle misalignment may be caused by a variation of the actual path of the incident ion beam from a desired path and/or a variation of the actual position of the substrate from a desired position of the substrate. Hence, it is desirable to determine any angle misalignment during an alignment check procedure before an implant. If there is an angle misalignment, the substrate may then be re-positioned relative to the incident ion beam to compensate for any angle misalignment. Measurement and correction of any angle misalignment is crucial to ensure accurate and repeatable angle performance of the implanter.

One method of determining angle misalignment between the incident ion beam and the target surface of the substrate requires a plurality of substrates during an alignment check procedure. Each of the plurality substrates is positioned at a different known offset angle by positioning the substrate relative to the ion beam and the entirety of each substrate is then implanted with ions from the incident ion beam. In a typical implementation of this procedure, nine separate substrates are implanted at nine different incident angles. Angle sensitive data from each substrate is then measured and the average value of the angle sensitive data from each is used to determine the angle misalignment. The angle misalignment may then be accounted for with an offset in the home position of the substrate.

This conventional method suffers from several drawbacks. First, material and processing costs increase with each substrate utilized. Second, it is difficult to ensure that each of the plurality of substrates has a similar surface orientation. This can then lead to inconsistency when measuring angle sensitive data from different substrates with slightly different surface orientations. Third, this method takes time that can adversely affect machine availability of the beam line ion implanter due to increased downtime. Fourth, variations in a substrate positioning apparatus may result in variations in substrate positioning for each substrate further degrading the quality of the results.

In semiconductor device manufacturing, the substrates may be cut from a crystalline semiconducting material that is grown into a cylindrical ingot. The substrates may therefore have a disk shape and may also be referred to as a wafer. These substrates may be sliced to obtain a desired crystalline plane at the target surface of the substrate and polished to ensure a flat target surface. However, the resulting target surface of the substrate may be formed from a miscut of the cylindrical ingot relative to the desired crystalline plane. This may sometimes be referred to in the art as "substrate miscut". A conventional ion implanter assumes that there is either no substrate miscut or that the substrate miscut stays the same for all substrates to be processed in the implanter, and this assumption may lead to angle misalignment of the substrate relative to the incident ion beam. The substrate miscut may vary depending on the particular source of the particular substrate and how it was sliced relative to the desired crystalline plane.

Accordingly, there is a need for an improved method to determine an angle misalignment between a target surface of a substrate and an incident ion beam in beam line ion implanters. There is also a need for a method to determine any crystal miscut in the substrate.

SUMMARY

According to a first aspect of the invention, a method is provided. The method includes directing an ion beam at a plurality of differing incident angles with respect to a target surface of a substrate to implant ions into a plurality of portions of the substrate, wherein each one of the plurality of differing incident angles is associated with a different one of the plurality of portions, measuring angle sensitive data from each of the plurality of portions of the substrate, and determining an angle misalignment between the target surface of the substrate and the ion beam incident on the target surface from the angle sensitive data.

According to another aspect of the invention, another method is provided. This method includes implanting a first plurality of portions of a first substrate with an ion beam at a first plurality of incident angles in a first plane, wherein each one of the first plurality of incident angles is associated with a different one of the first plurality of portions, the first substrate positioned at a first rotation position during implantation. The method further includes implanting a second plurality of portions of a second substrate with the ion beam at the first plurality of incident angles, the second substrate positioned at a second rotation position during implantation that is rotated 180° relative to the first rotation position, the first and second substrate cut from a source, measuring angle sensitive data from the first and second substrate, and comparing the angle sensitive data from the first and second substrate to determine a first substrate miscut angle in a first direction.

According to yet another aspect of the invention, another method is provided. The method includes: directing an ion beam at a first plurality of differing horizontal incident angles with respect to a target surface of a substrate having a disk shape to implant ions into associated portions of a first quadrant of a first half of the substrate when the substrate is in a first position; rotating the substrate 180° from the first position to a second position; directing the ion beam at the first plurality of differing horizontal incident angles to implant ions into associated portions of a second quadrant of the substrate on a second half of the substrate when the substrate is in the second position; rotating the substrate 90° from the second position to a third position; directing the ion beam at a second plurality of differing vertical incident angles to implant ions into associated portions of a third quadrant of the first half of the substrate when the substrate is in the third position; rotating the substrate 180° from the third position to a fourth position; directing the ion beam at the second plurality of differing vertical incident angles to implant ions into associated portions of a fourth quadrant of the second half of the substrate when the substrate is in the fourth position;

measuring angle sensitive data from each of the quadrants; determining an angle misalignment in a horizontal and a vertical direction between the target surface and the ion beam incident on the target surface from the angle sensitive data; and determining a substrate miscut angle in a horizontal and a vertical direction between a desired crystalline plane and an actual plane of the target surface of the substrate from the angle sensitive data.

BRIEF DESCRIPTION OF THE DRAWINGS

For a better understanding of the present disclosure, reference is made to the accompanying drawings, in which.

DETAILED DESCRIPTION

Figure 1:
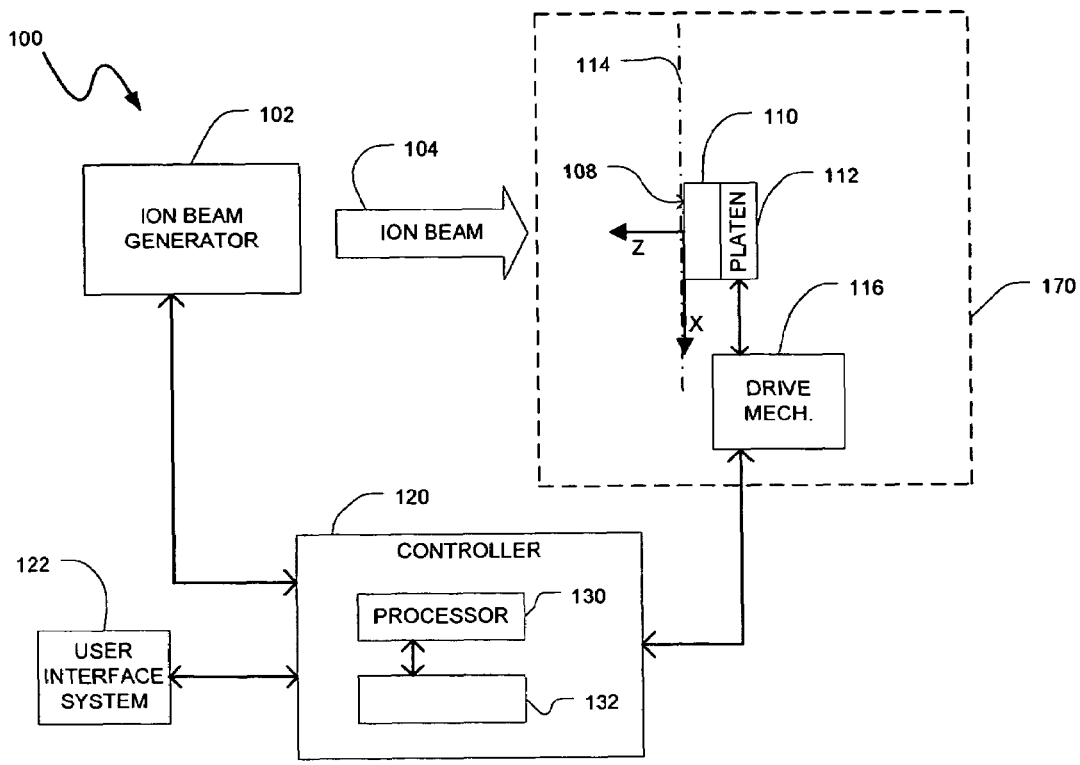
FIG. 1 is a top view of a block diagram of a beam line ion implanter.

Turning to FIG. 1, a top view of a block diagram of a beam line ion implanter 100 is illustrated. The beam line ion implanter 100 may include an ion beam generator 102, an end station 170, a controller 120, and a user interface system 122. The ion beam generator 102 is configured to generate a well defined ion beam 104 and direct the ion beam toward a target surface 108 of a substrate 110 positioned in the end station 170. The ion beam 104 may be distributed over the target surface 108 of the substrate 110 by beam movement, substrate movement, or by any combination thereof.

The ion beam generator 102 can include various types of components and systems to generate the ion beam 104 having desired characteristics. The ion beam 104 may be a spot beam or a ribbon beam. The spot beam may have an irregular cross-sectional shape that may be approximately circular in one instance. The spot beam may be a fixed or stationary spot beam without a scanner. Alternatively, the spot beam may be scanned by a scanner for providing a scanned ion beam. The ribbon beam may have a large width/height aspect ratio and may be at least as wide as the substrate 110. The ion beam 104 can be any type of charged particle beam, such as an energetic ion beam used to implant the substrate 110.

The end station 170 may support one or more substrates in the path of the ion beam 104 such that ions of the desired species are implanted into the substrate 110. The substrate 110 may be supported by the platen 112 and clamped to the platen 112 by known techniques such as electrostatic substrate clamping. The target surface 108 of a properly cut substrate 110 in an implant position may define a substrate plane 114. The substrate 110 can take various physical shapes such as a common disk shape. The substrate 110 can be a semiconductor substrate fabricated from any type of semiconductor material such as silicon or any other material that is to be implanted using the ion beam 104.

The end station 170 may include a substrate drive system (not illustrated) to physically move the substrate 110 to and from the platen 112 from holding areas. The end station 170 may also include a drive mechanism 116 to drive the platen 112 and hence the substrate 110 clamped to the platen 112 in a desired way. The drive mechanism 116 may include servo drive motors, screw drive mechanisms, mechanical linkages, and any other components as are known in the art to drive the substrate 110 when clamped to the platen 112.

The controller 120 may receive input data and instructions from any variety of systems and components of the beam line ion implanter 100 and provide output signals to control the same. The controller 120 can be or include a general-purpose computer or network of general-purpose computers that may be programmed to perform desired input/output functions. The controller 120 may include a processor 130 and a machine readable medium 132. The processor 130 may include one or more processors known in the art such as those commercially available from Intel Corporation. The machine readable medium 132 may include on or more machine readable storage media such as random-access memory (RAM), dynamic RAM (DRAM), magnetic disk (e.g., floppy disk and hard drive), optical disk (e.g., CD-ROM), and/or any other device that can store instructions for execution. The controller 120 can also include other electronic circuitry or components, such as application specific integrated circuits, other hardwired or programmable electronic devices, discrete element circuits, etc.

The user interface system 122 may include, but not be limited to, devices such as touch screens, keyboards, user pointing devices, displays, printers, etc. to allow a user to input commands and/or data and/or to monitor the beam line ion implanter 100 via the controller 120.

Figure 2:
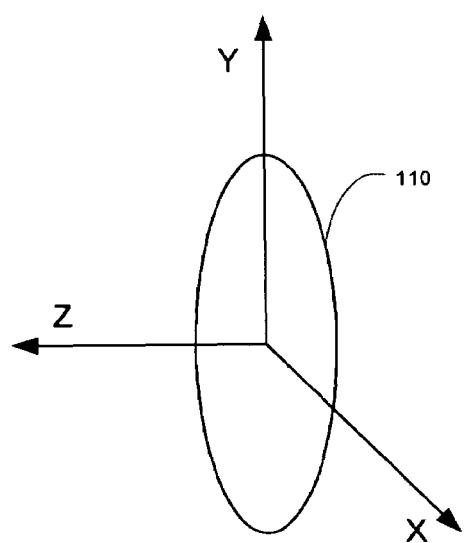
FIG. 2 is a perspective view of the substrate of FIG. 1.

FIG. 2 is a perspective view of the substrate 110 of FIG. 1 to illustrate a coordinate system defined relative to the substrate plane 114 defined by the target surface of the substrate 110. The origin of the coordinate system is at the center of the substrate 110 properly positioned for implantation in the substrate plane 114. The X axis is horizontal and in the substrate plane 114, the Y axis is vertical and in the substrate plane 114, and the Z axis is perpendicular to the substrate plane 114 in the general direction of travel of the ion beam 104.

During implantation, the ion beam 104 strikes the substrate at a particular incident angle of the ion beam relative to the target surface 108 of the substrate 110. The actual incident angle may deviate from a desired incident angle if there is an angle misalignment between the target surface of the substrate 110 and the ion beam 104 incident on the target surface. Therefore, it is desirable to determine if there is any angle misalignment during an alignment check procedure and position the substrate 110 at a particular offset in the home position of the substrate to compensate for any angle misalignment.

Figure 3:
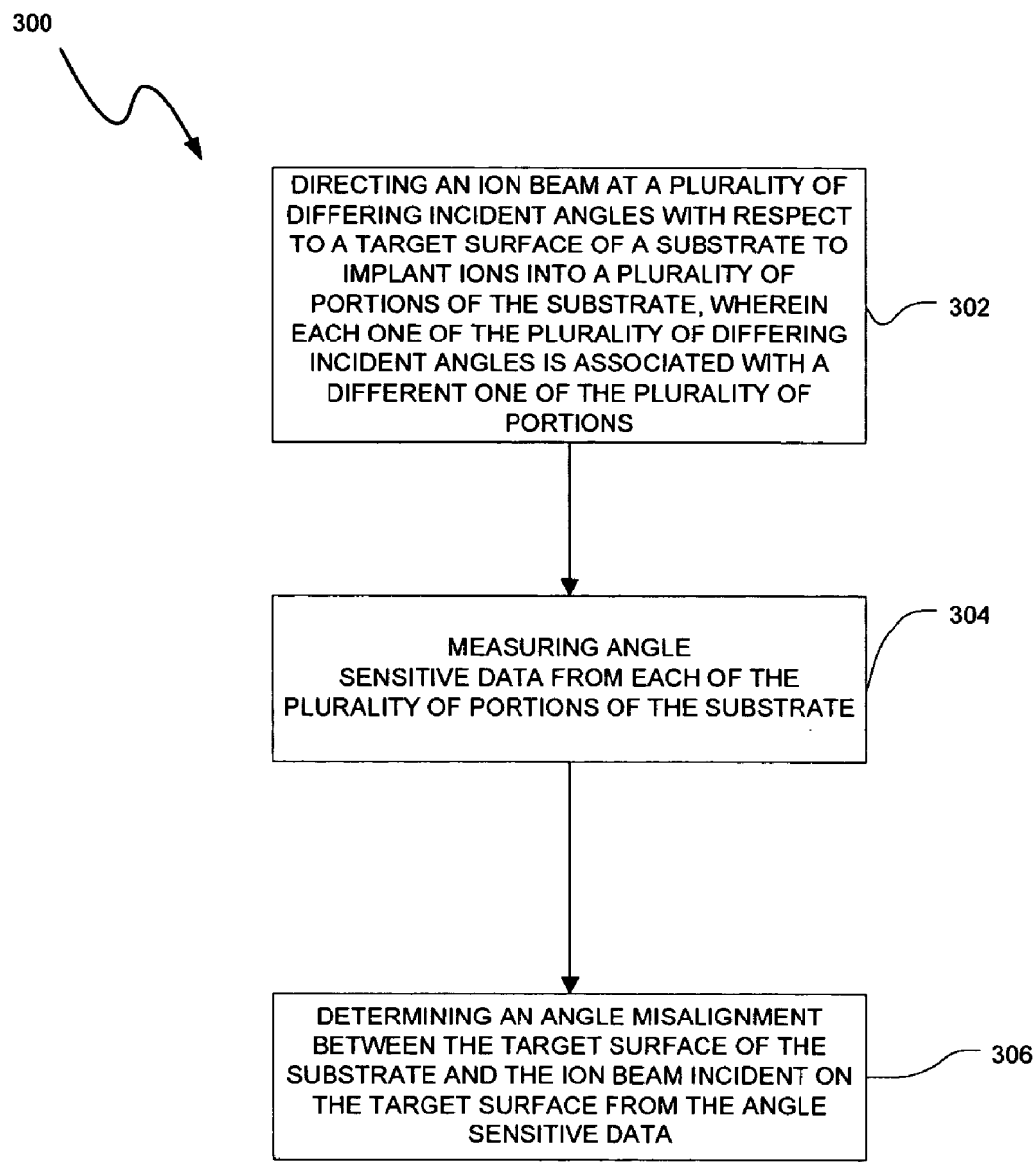
FIG. 3 is a flow chart of operations consistent with an embodiment.

FIG. 3 is a flow chart of operations 300 consistent with an embodiment to determine an angle misalignment between the target surface of the substrate and the ion beam incident on the target surface. The operations include directing an ion beam at a plurality of differing incident angles with respect to a target surface of a substrate to implant ions into a plurality of portions of the substrate, wherein each one of the plurality of differing incident angles is associated with a different one of the plurality of portions. The operations further include measuring angle sensitive data from each of the plurality of portions of the substrate 304, and determining an angle misalignment between the target surface of the substrate and the ion beam incident on the target surface from the angle sensitive data 306.

There are several ways to achieve differing incident angles on different portions of the substrate. These include tilting the substrate, deflecting the ion beam, or some combination of the two. The incident angle could be a horizontal angle in a horizontal plane, a vertical angle in a vertical plane, or some combination of the two.

Figure 4:
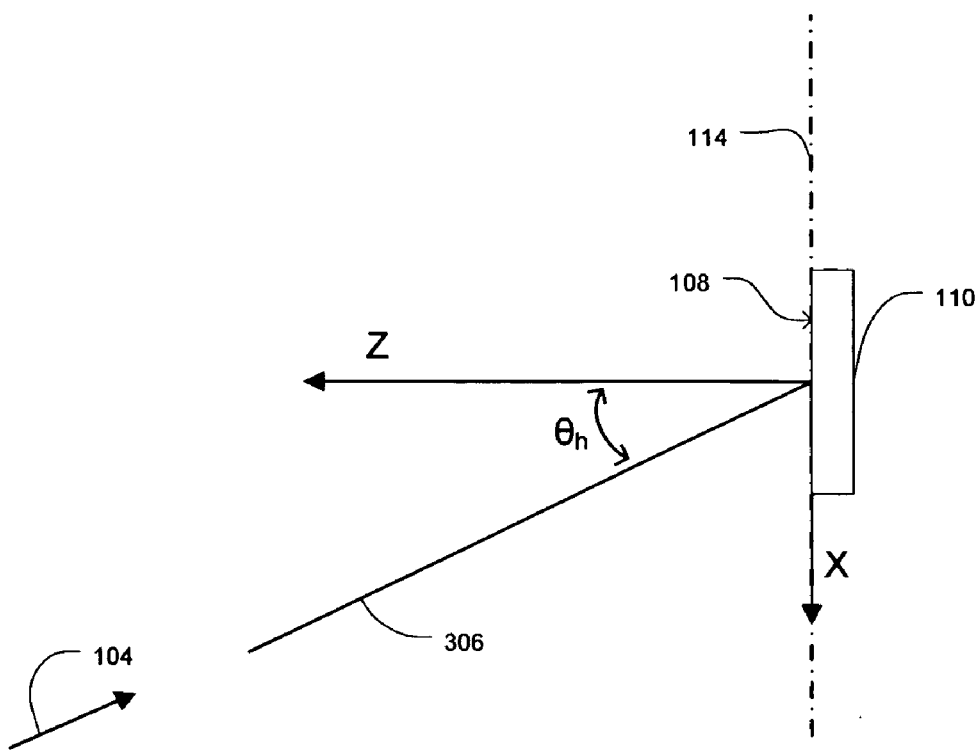
FIG. 4 is a partial schematic top view of a portion of the beam line implanter of FIG. 1 illustrating horizontal incident angles.

FIG. 4 is a top view of a portion of the beam line implanter 100 of FIG. 1 illustrating a horizontal incident angle $\theta_h$ in a horizontal (X-Z) plane. In the example of FIG. 4, the ion beam 104 is positioned relative to the target surface 108 of the substrate 110 such that the path 306 of the ion beam striking the target surface is at a horizontal incident angle $\theta_h$. The horizontal angle $\theta_h$ is the angle measured with respect to a normal direction (Z axis) to the target surface 108 of the substrate 110 in the horizontal (X-Z) plane.

Figure 5:
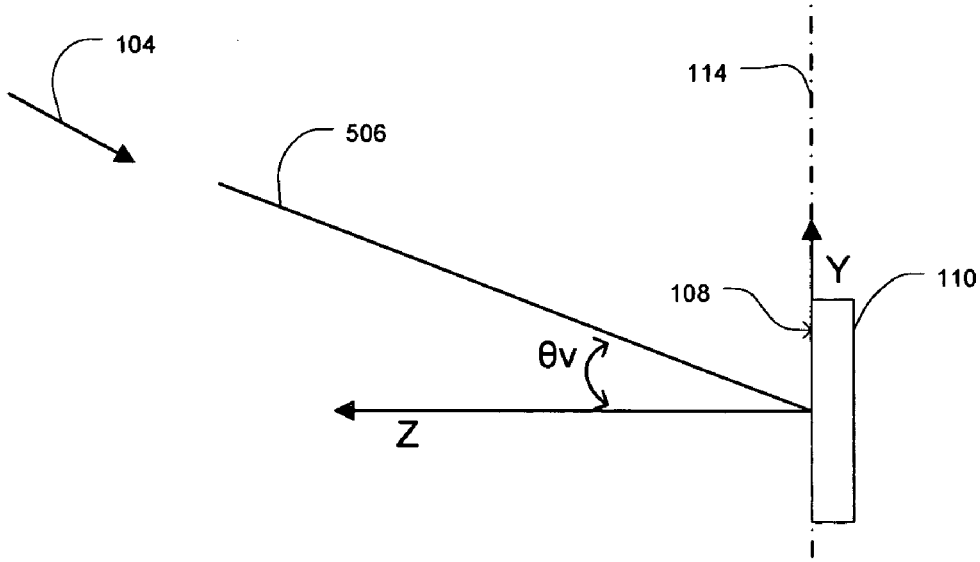
FIG. 5 is a partial schematic side view of a portion of the beam line implanter of FIG. 1 illustrating vertical incident angles.

FIG. 5 is a side view of a portion of the beam line implanter 100 of FIG. 1 illustrating a vertical incident angle $\theta_v$ in a vertical (Y-Z) plane. In the example of FIG. 5, the ion beam 104 is positioned relative to the substrate 110 such that the path 506 of the ion beam striking target surface of the substrate 110 is at a vertical incident angle $\theta_v$. The vertical angle $\theta_v$ is the angle measured with respect to a normal direction (Z axis) to the target surface of the substrate 110 in the vertical (Y-Z) plane. An actual incident angle could have both a horizontal angle component as illustrated in FIG. 4 and a vertical angle component as illustrated in FIG. 5.

One way to achieve differing incident angles on different portions of a single substrate includes tilting the substrate as the ion beam is distributed across the target surface of the substrate. Tilting of the substrate may be accomplished by the drive mechanism 116 of FIG. 1 tilting the platen 112 and hence a substrate secured thereto in a desired fashion.

Figure 6A:
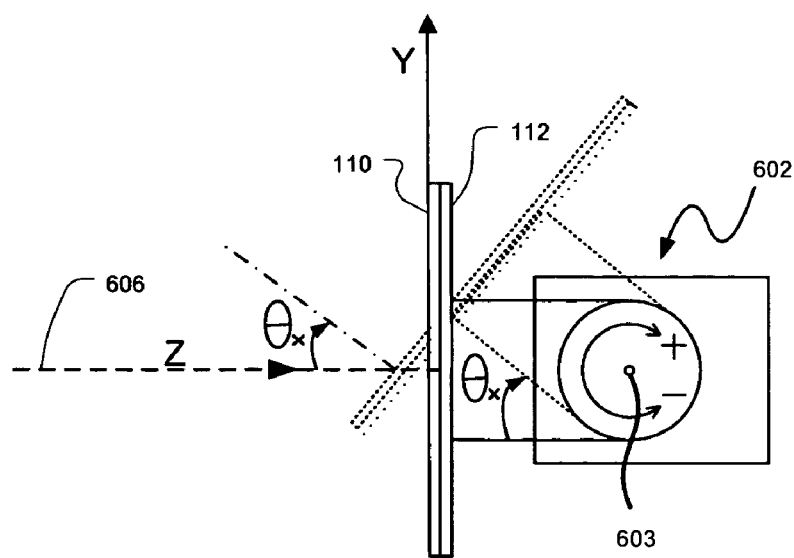
FIG. 6A is a partial schematic side view of one embodiment of a drive mechanism for tilting the substrate and FIG. 6B is a top view of the same.
Figure 6B:
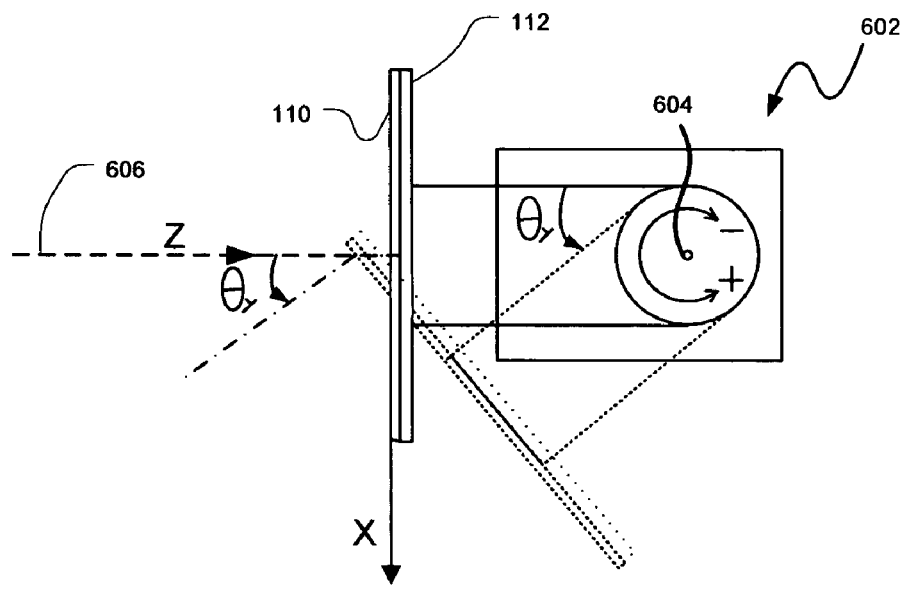

FIG. 6A is a side view of one embodiment of a drive mechanism 602 for tiling the substrate 110, while FIG. 6B is a top view of the same. The drive mechanism 602 is configured to tilt the substrate 110 about two axes 603 and 604. The drive mechanism 602 may tilt the substrate 110 up and down about a first axis 603 parallel with the X axis (FIG. 6A) and/or tilt the substrate 110 side to side about a second axis 604 parallel with the Y axis (FIG. 6B).

Tilting the substrate up and down about the first axis 603 changes the vertical incident angle and tilting the substrate side to side about the second axis 604 changes the horizontal incident angle. For example, assume the ion beam 606 is initially coincident with the Z axis so that the ion beam has a normal incident angle on the target surface of the substrate 110 in both the horizontal (X-Z) plane and the vertical (Y-Z) plane. If the substrate 110 is tilted up by an angle $\theta_x$ as illustrated in FIG. 6A, the vertical incident angle of the ion beam 606 will also be at that angle $\theta_x$ with respect to the normal incidence of the substrate 110. The angle $\theta_x$ may also be referred to an X-tilt angle since the substrate 110 is tilted about the first axis 603 that is parallel with X axis. Alternatively, if the substrate 110 is tilted to one side by an angle $\theta_y$ as illustrated in FIG. 6B, the horizontal incident angle of the ion beam 606 will also be at that angle $\theta_y$ with respect to the normal incidence of the substrate 110. The angle $\theta_y$ may also be referred to a Y-tilt angle since the substrate is tilted about the second axis 604 that is parallel with the Y axis.

Figure 7A:
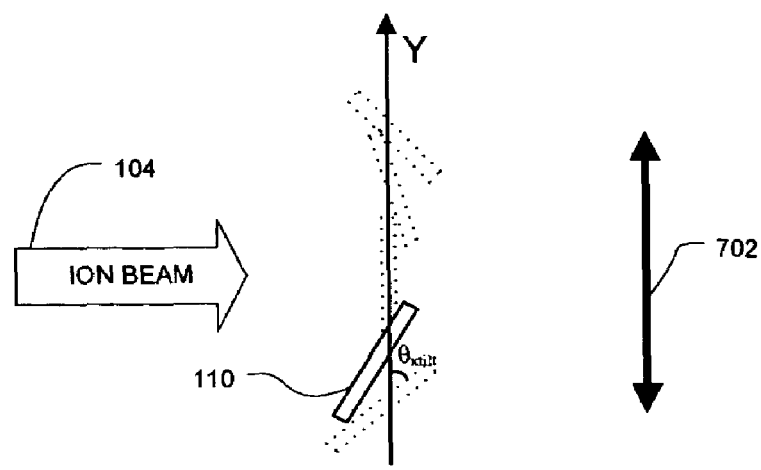
FIG. 7A is a side view of a substrate having different tilting positions to achieve different incident angles on the substrate.

Turning to FIG. 7A, one example of tilting a substrate 110 to achieve different incident angles on different portions of the substrate 110 is illustrated. In the embodiment of FIG. 7A, the substrate 110 is mechanically driven in the Y direction as indicated by arrow 702. As the substrate is driven in the Y direction, it may be tilted at differing X tilt positions resulting in differing vertical incident angles. In one embodiment, the tilting of the substrate may be accomplished by the drive mechanism 602 tilting the substrate about the axis 603 as it is driven in the Y direction. Although FIG. 7A illustrates tilting only in differing X tilt positions, the substrate may also be tilted in differing Y tilt positions as well as it is mechanically driven in the Y direction.

Figure 7B:
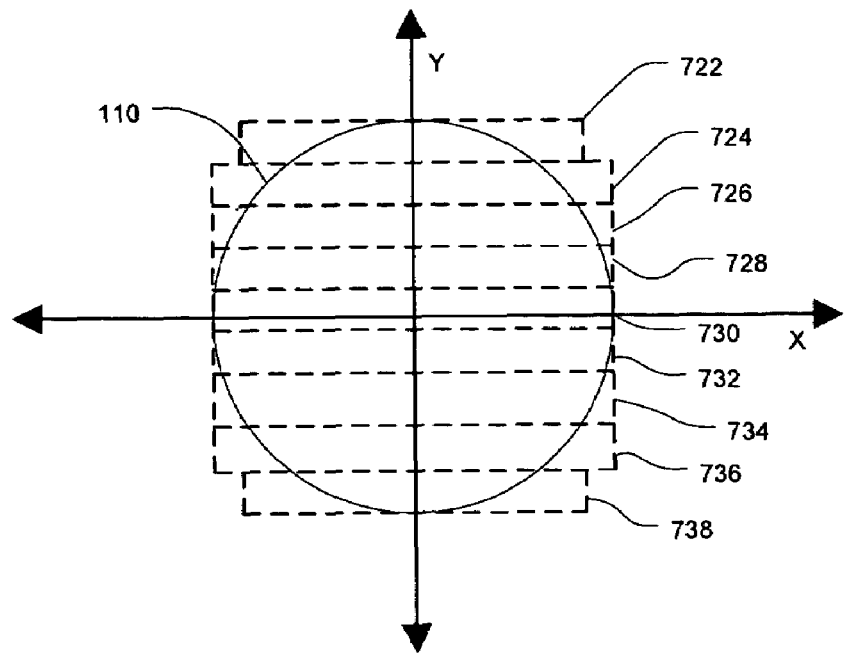
FIG. 7B is a view of the target surface of the substrate of FIG. 7A.

FIG. 7B is a view of the target surface of the substrate 110 of FIG. 7A illustrating a plurality of differing portions 722, 724, 726, 728, 730, 732, 734, 736, 738 of the substrate where an incident ion beam has a different incident angle on each portion. The incident angles may be varied either incrementally or continuously. For example, if the incident angle is varied incrementally the substrate 110 may be driven in the Y direction a particular distance at the same first X tilt angle to implant a first portion 722 of the substrate. The substrate may continue to be driven in the Y direction another distance at a different X tilt angle to implant a second portion 724 of the substrate and so on. The tilting of the substrate 110 may also be varied continuously in the X or Y direction as the substrate is driven in the Y direction.

Another way to achieve differing incident angles on different portions of a single substrate includes deflecting the ion beam to desired beam angles. This may be accomplished by one or more active beam elements in the beam path of a beam line ion implanter. The deflection of the ion beam may be achieved by changing one or more magnetic fields, electric fields, or a combination thereof.

Figure 8:
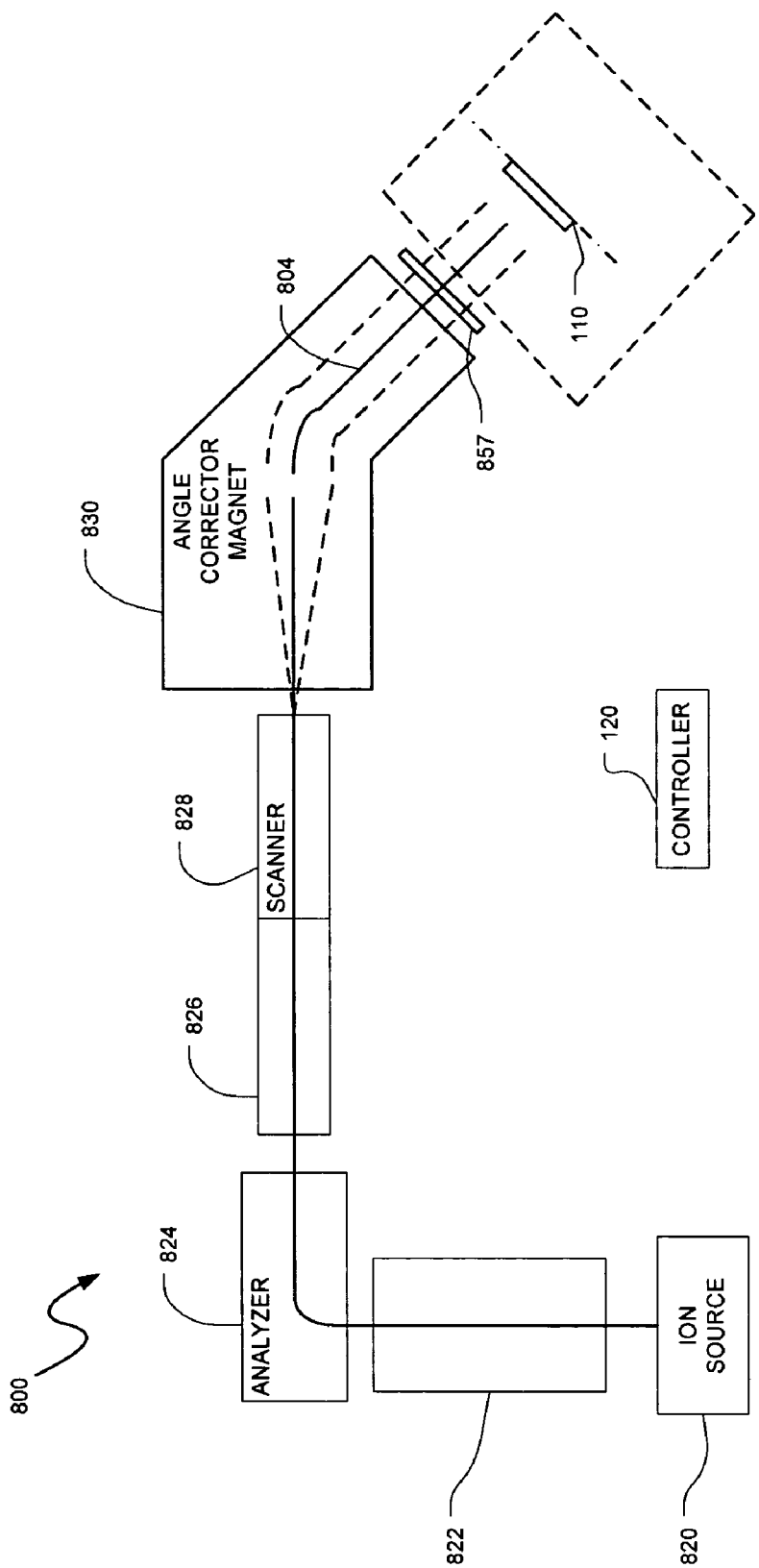
FIG. 8 is a block diagram of a beam line ion implanter.

FIG. 8 is a block diagram of one beam line ion implanter 800 having one or more active beam elements in the beam path to deflect the ion beam to desired beam angles. Many other beam line ion implanters will be known to those skilled in the art and the embodiment of FIG. 8 is provided by way of example only and is not intended to be limiting.

The beam line ion implanter 800 may include an ion source 820, an extraction electrode 822, a mass analyzer 824, a resolving aperture 826, a scanner 828, and an angle corrector magnet 830. For clarity of illustration, the controller 120 is illustrated in isolation. Those skilled in the art will recognize that the controller 120 may provide output signals to each component of the beam line ion implanter 800 and receive input signals from at least the same.

The ion source 820 may generate ions and may include an ion chamber and a gas box. The gas may be supplied from the gas box to the ion chamber where it is to be ionized. The ions thus formed may be extracted from the ion source 820. The extraction electrode 822 and an extraction power supply may accelerate ions from the ion source. The mass analyzer 824 may include a resolving magnet that deflects ions so that ions of a desired species pass through the resolving aperture 826 and undesired species do not pass through the resolving aperture 826. A scanner 828 positioned downstream from the resolving aperture 826 may include an electrostatic scanner or a magnetic scanner for deflecting the ion beam back and forth. The scanner 828 is not required for other ion implanters using a ribbon beam. The angle corrector magnet 830 deflects ions of the desired ion species to normally convert a diverging ion beam to a nearly collimated ion beam having substantial parallel ion trajectories.

One beam element to deflect the ion beam may be the extraction electrode 822 as electrostatic fields may be varied to tailor the ion beam angles. Another beam element is the scanner 828. The shape or geometry of scan plates of the scanner may be varied to achieve different ion beam angles. Yet another beam element to deflect the ion beam is the angle corrector magnet 830. The magnetic field provided by the angle corrector magnet 830 may be varied to cause the ion beam 804 to deflect from its nominal incident angle. For example, a varying current may be supplied to the multi-poles (not illustrated) in the corrector magnet 830 to control the local magnetic fields that change the incident angles of the ion beam. Similarly, the positions of one or more steel rods (not illustrated) that shape the magnetic field inside the corrector magnet 830 may be changed to control the ion beam angles. The magnetic field of the corrector magnet 830 is typically tuned to an optimum strength to provide for a nearly collimated ion beam 804 having substantially parallel ion trajectories. However, if the corrector magnet 830 is detuned below this optimum strength, diverging ion beam trajectories will result. On the other hand, if the corrector magnet 830 is detuned above this optimum strength, converging ion beam trajectories will result.

Yet another beam element to deflect the ion beam is a parallelizing lens (not illustrated). The parallelizing lens may take the place of the angle corrector magnet 830 in some ion implanter embodiments and serve the same general function by deflecting a diverging ion beam from the scanner 828 to normally a near collimated ion beam having substantial parallel ion trajectories. The parallelizing lens may include a set of electrodes that are differentially biased as is known in the art to focus the diverging ion beam with an electric field. Adjusting the strength of the electric field can change the ion beam trajectories similarly as adjusting the magnetic field strength for the angle corrector magnet 830.

Yet another beam element to deflect the ion beam may be at least one magnetic dipole element (not illustrated). A magnetic dipole element may be located before and/or after the angle corrector magnet 830. By perturbing at least one magnetic dipole element, the ion beam may be deflected to desired angles. Yet another beam element to deflect the ion beam may be a deceleration lens 857. In one embodiment, the deceleration lens may be positioned downstream from the angle corrector magnet 830 and adjusting the deceleration lens 857 can adjust the spatial angle distributions in the ion beam.

Figure 9A:
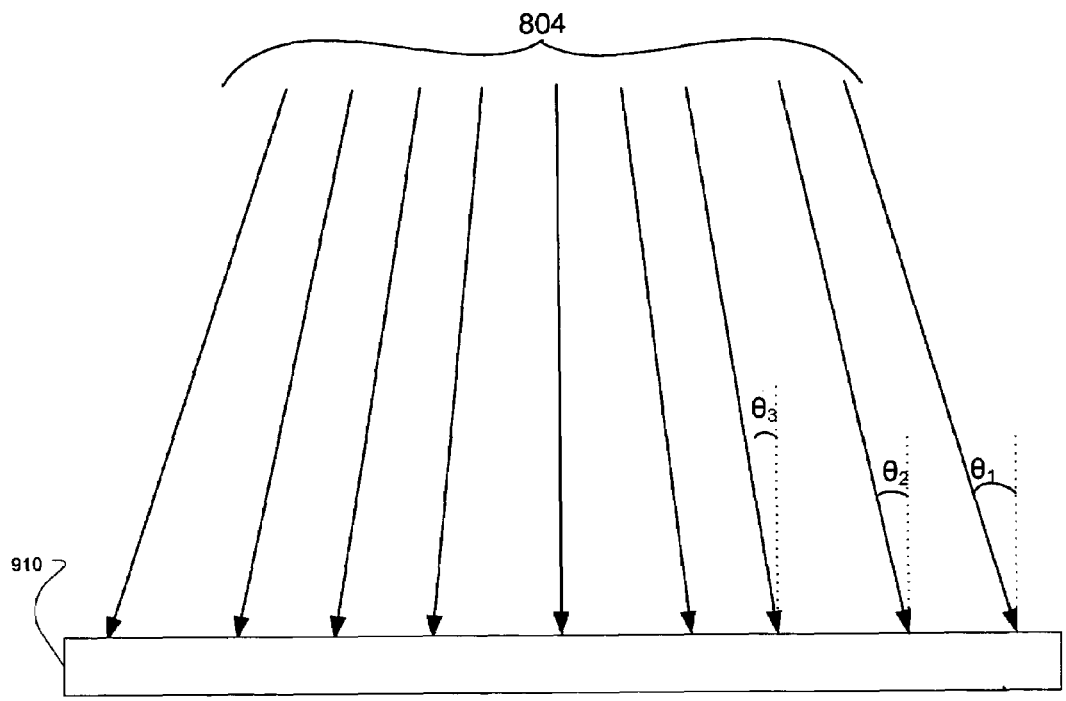
FIG. 9A is a side view of a substrate having different incident angles on different portions of the substrate by controlling the trajectory of the ion beam.

FIG. 9A is an example of ion beam 804 having diverging ion trajectories to result in different incident angles ($\theta_1$, $\theta_2$, $\theta_3$, etc.) on different portions of the substrate 910. This diverging ion beam 804 may be a scanned spot ion beam, e.g., scanned by scanner 828, where the angle corrector magnet is detuned to provide the diverging ion trajectories. The diverging ion beam 804 may also be a ribbon beam having a large width/height aspect ratio with a width at least as wide as the substrate 110, where the angle corrector magnet 110 is also detuned to provide the diverging ion trajectories.

Figure 9B:
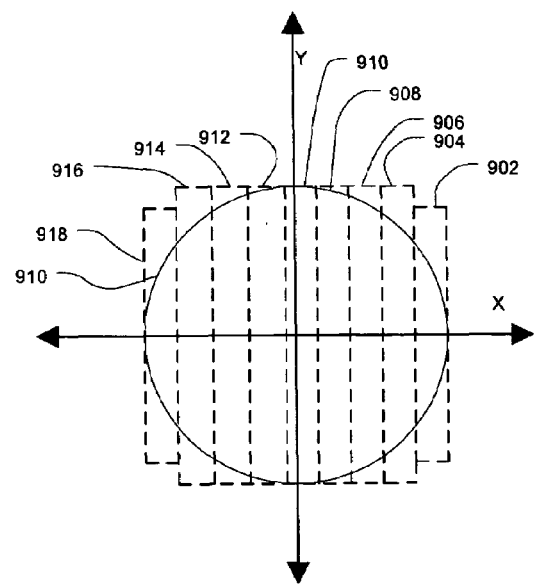
FIG. 9B is a view of the target surface of the substrate of FIG. 9A.

FIG. 9B is a front view of the target surface of the substrate of FIG. 9A illustrating nine different regions or bands 902, 904, 906, 908, 910, 912, 914, 916, 918 each having a range of incident angles from the diverging ion beam 804.

By either tilting the substrate, deflecting the ion beam, or a combination of the two, a desired distribution of both horizontal and vertical incident angles may be achieved on differing portions of the substrate. Once a substrate is implanted with this desired distribution of incident angles, angle sensitive data of the substrate can be measured. One example of a desired distribution of both effective horizontal and vertical angles is given in Table 1. In the example of Table 1, nine different portions of the substrate may be implanted at nine different effective Y and X-tilt angles. An effective Y-tilt angle ($\theta_y$ of FIG. 6B) results in a corresponding horizontal incident angle ($\theta_h$ of FIG. 4). An effective X-tilt angle ($\theta_x$ of FIG. 6A) results in a corresponding vertical incident angle ($\theta_v$ of FIG. 5).

TABLE 1

| Substrate Portion | Effective Y-tilt angle | Effective X-tilt angle |
|---|---|---|
| 1 | −1.0° | 0° |
| 2 | −0.5° | 0° |
| 3 | 0° | 0° |
| 4 | +0.5° | 0° |
| 5 | +1.0° | 0° |
| 6 | 0° | −1.0° |
| 7 | 0° | −0.5° |
| 8 | 0° | +0.5° |
| 9 | 0° | +1.0° |

In one embodiment, the angle sensitive data is representative of damage to the crystalline structure of the substrate. This damage is proportional to the depth of the implanted ions as well as the relative incident angle of the ion beam with respect to the crystal orientation and hence the incident angle. One way to measure such damage is with a metrology tool such as a Therma-Probe® tool manufactured by Therma-Wave Inc. of Fremont, Calif. Therma-Probe® is a registered trademark of Therma-Wave Inc. of Fremont, Calif. The Therma-Probe® tool estimates the damage to the crystal lattice through a measured change in the refractive index of the substrate due to the implant. Hence, the amount of damage can be correlated to the actual incident angle to determine a misalignment between the substrate and the incident ion beam. An offset position of one or both of the X and Y tilt angles can then be determined to compensate for the angle misalignment.

Figure 10A:
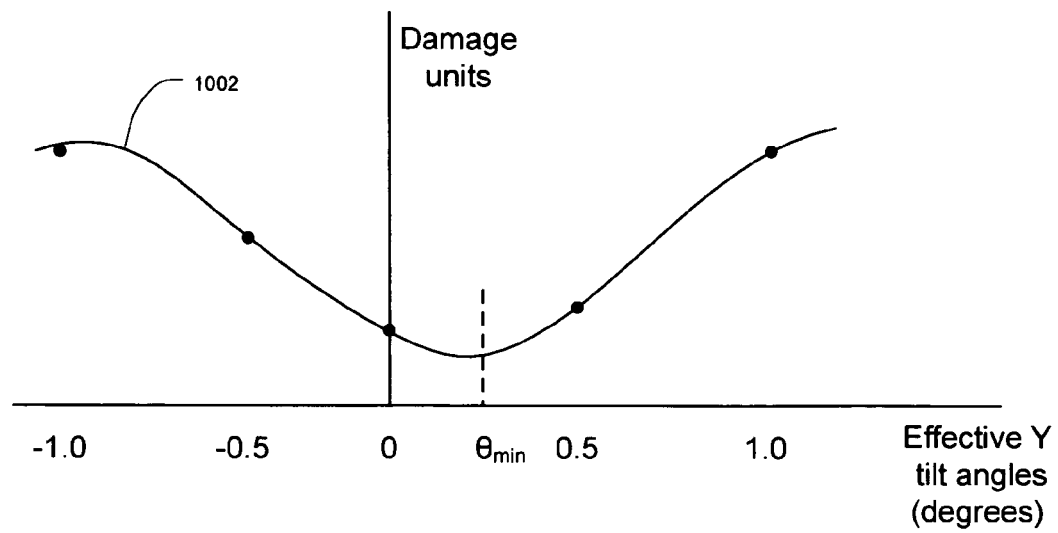
FIG. 10A is a plot of angle sensitive data to determine a vertical offset tilt angle to compensate for horizontal angle misalignment.
Figure 10B:
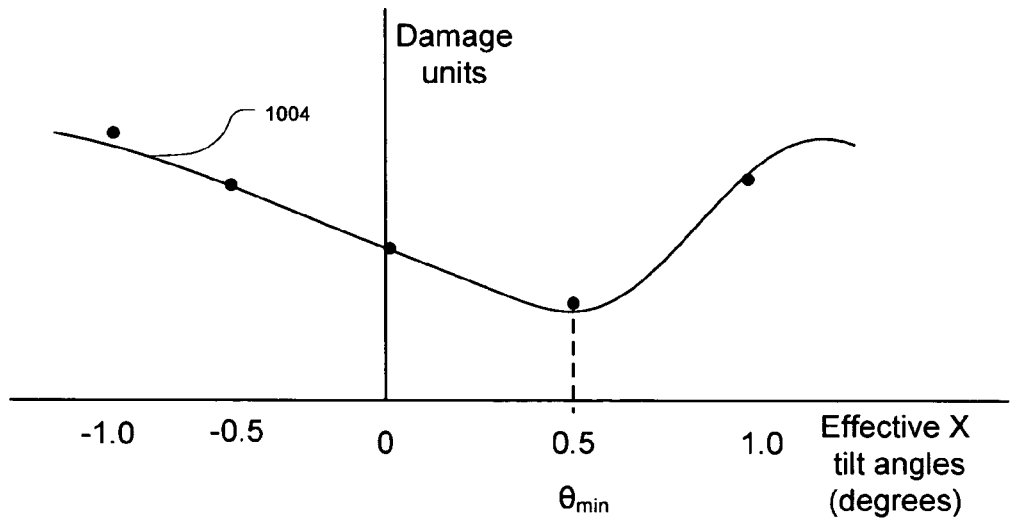
FIG. 10B is a plot of angle sensitive data to determine a horizontal offset tilt angle to compensate for vertical angle misalignment.

For example, one substrate may be implanted with a distribution of differing effective Y and X tilt angles given in Table 1. As illustrated in FIG. 10A, a plot 1002 damage to the substrate versus effective Y tilt incident angles with no effective X tilt for portions 1-5 of the substrate as detailed in Table 1 may then be plotted. The damage units to the substrate may be Therma-Wave infinity units obtained using the Therma-Probe®. As illustrated in FIG. 10B, another plot 1004 of damage to the substrate versus effective X tilt incident angles with no effective Y tilt may also be plotted for portions 3, and 6-9 of the substrate as detailed in Table 1. Each plot may have a general "V" shape and may therefore be referred to in the art as a "V-curve." The effective Y-tilt or X-tilt angle when the V-curve is at a minimum represents the particular Y or X offset tilt angle to set the substrate in its home position before an implant to compensate for the angle misalignment. For example, the V-curve 1002 is at a minimum at an effective Y tilt angle of 0.25° resulting in a vertical offset tilt angle (Y-tilt) or adjustment of the same and the V-curve 1004 is at a minimum at an effective X-tilt angle of 0.5° resulting in a horizontal offset tilt angle (X-tilt) or adjustment of the same.

In other embodiments, the angle sensitive data may be representative of a change in conductivity of the substrate. The change in conductivity may be measured for each of the plurality of portions of the substrate where a differing incident angle of the ion beam struck the target surface of the substrate. The change in conductivity may be determined by measuring the sheet resistance of the substrate in each of the plurality of portions. As is known in the art, a four point probe which inputs a test current at one point and measures a return current at another point may be utilized to determine sheet resistance which is usually expressed in units of Ω/square. The sheet resistance measured at each of the plurality of portions of the substrate can be correlated to the incident angle of the ion beam to determine a proper X-tilt and or Y-tilt offset for positioning the substrate in its home position.

In yet a further embodiment, the angle sensitive data may be representative of a dopant profile of a concentration of ions implanted in the substrate versus a depth from a target surface of the substrate. Known techniques such as a Secondary Ion Mass Spectrometry (SIMS) technique may be utilized to measure such dopant profiles and may be referred to in the art as a SIMS profile. A SIMS profile may be obtained for each of the plurality of portions of the substrate where a differing incident angle of the ion beam struck the target surface of the substrate. A dopant profile with a comparatively larger concentration of dopant at a greater depth indicates some channeling of the dopant through the crystalline lattice of the substrate. The comparative dopant profiles can therefore be correlated to the incident angle of the ion beam.

In yet another embodiment, the angle sensitive data may be a measured backscattering value when the substrate is bombarded with test source. For example, a Rutherford Backscattering Spectroscopy (RBS) technique may be utilized and the monitored value of backscattering may be correlated to the incident angle at that particular location on the substrate. The angle sensitive data may also be obtained from other techniques such as infrared (IR) absorption, photoreflectance, and emissivity techniques.

Figure 11A:
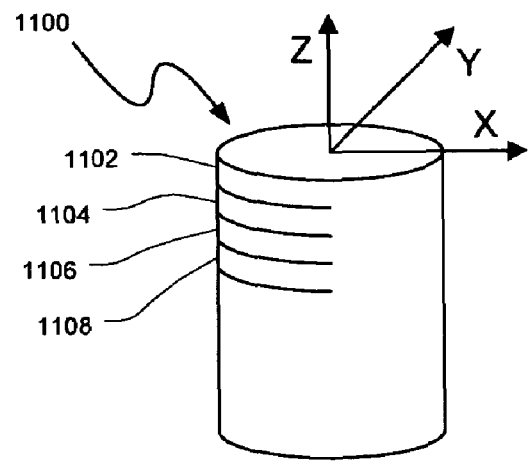
FIG. 11A is a perspective view of a cylindrical ingot to be sliced to fabricate a plurality of substrates.

Turning to FIG. 11A, a plurality of substrates may be sliced from of a source. One source may be a material that is grown into a cylindrical ingot 1100. In one embodiment, the cylindrical ingot 1100 may be made out of pure silicon that is grown up to 300 millimeters in diameter. The cylindrical ingot 1100 is then sliced into individual substrates 1102, 1104, 1106, 1108, etc. about 0.75 mm thick in some instances. A Cartesian coordinate system consistent with that of FIG. 2 is also illustrated in FIG. 11A.

Figure 11B:
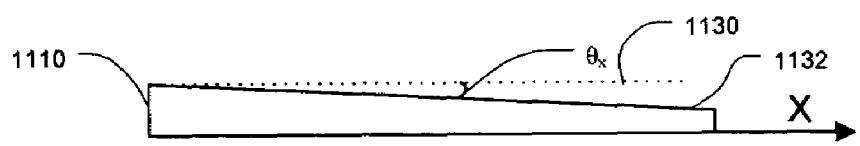
FIG. 11B is a cross sectional view of substrate having a substrate miscut in the X direction of FIG. 11A.
Figure 11C:
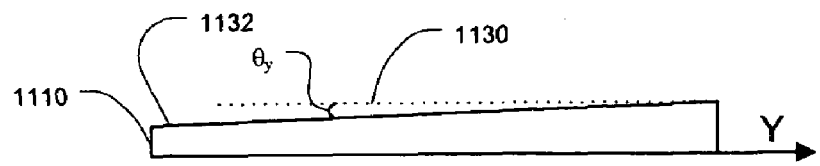
FIG. 11C is a cross sectional view of the same having a substrate miscut in the Y direction of FIG. 11A.

The cylindrical ingot 1100 should be sliced to form a desired crystalline plane having a desired crystalline orientation. However, the resulting target surface of the substrate may be formed from an inadvertent cut of the cylindrical ingot relative to the desired crystalline plane which is referred to herein as a "substrate miscut". FIG. 11B is a cross sectional view of a substrate 1110 along the X axis of FIG. 11A illustrating a horizontal substrate miscut angle $\theta_x$ of a target surface of the substrate 1110 in the X direction. The horizontal substrate miscut angle $\theta_x$ in the X direction is the angle between a desired crystalline plane 1130 having a desired crystalline structure and the actual target surface 1132 in the same X direction. FIG. 11C is a cross sectional view of the same substrate 1110 along the Y axis of FIG. 11A illustrating a vertical substrate miscut angle $\theta_y$ of a target surface of the substrate 1110 in the Y direction. The vertical substrate miscut angle $\theta_y$ in the Y direction is the angle between a desired crystalline plane 1130 having a desired crystalline structure and the actual target surface 1132 in the same Y direction. Some substrates may have no substrate miscut angle, only one substrate miscut angle in one of the X and Y direction, or both substrate miscut angles in both X and Y directions which may be similar or different from each other.

Figure 12A:
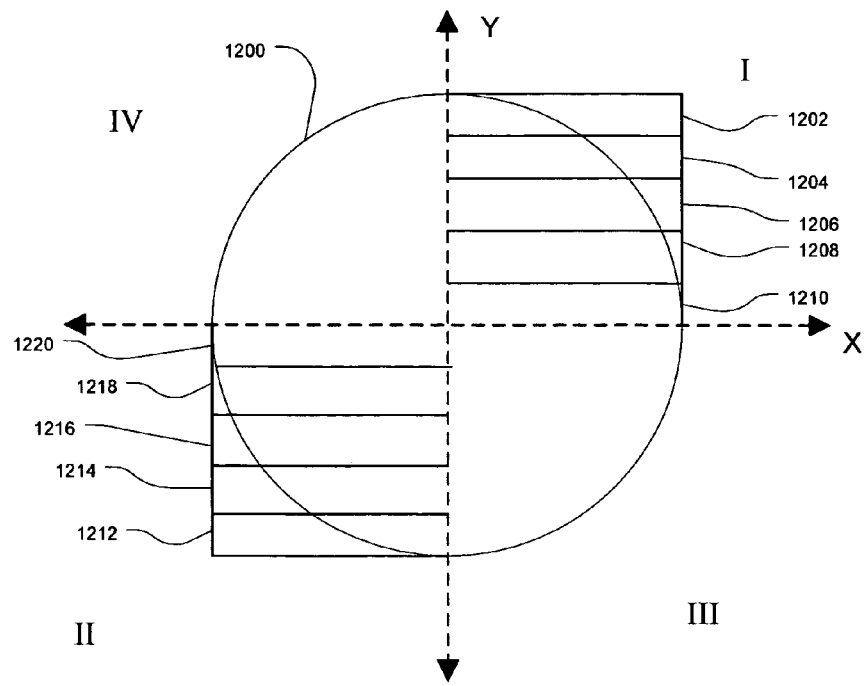
FIG. 12A is a front view of a substrate.
Figure 12B:
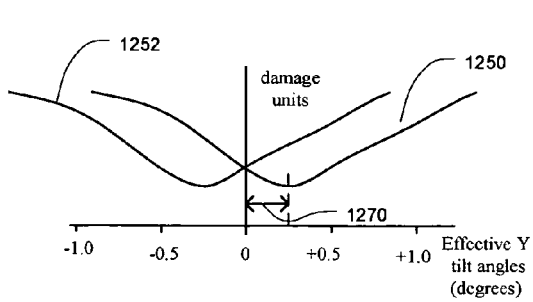
FIGS. 12B and 12C are plots to illustrate how the implant pattern of the substrate of FIG. 12A can determine both angle misalignment and substrate miscut from one wafer.
Figure 12C:
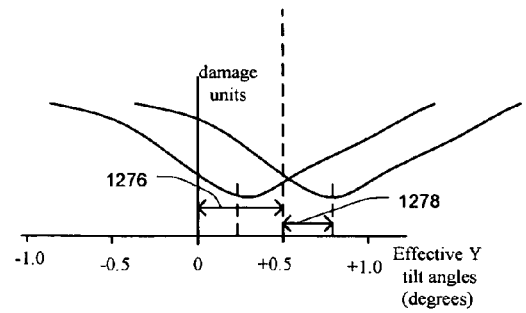
Figure 13A:
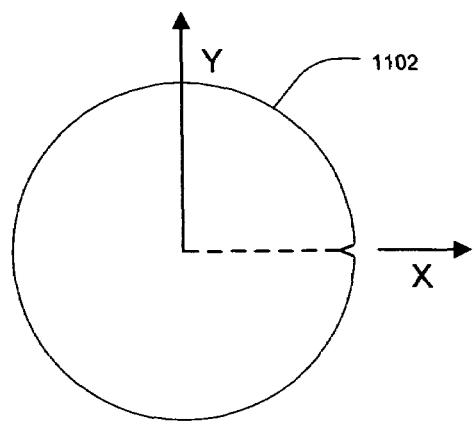
FIGS. 13A-13D are front views of four different substrates rotated 90° from each other in order to determine substrate miscut angles.
Figure 13B:
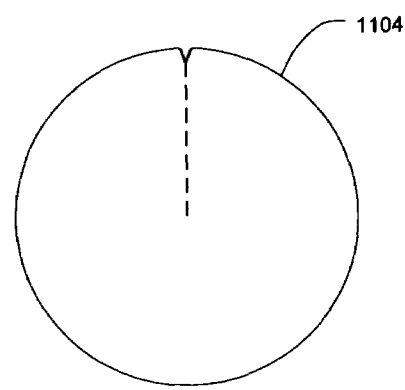
Figure 13C:
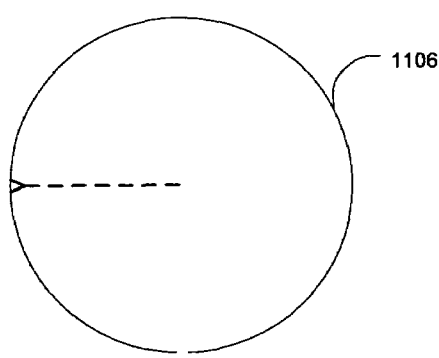
Figure 13D:
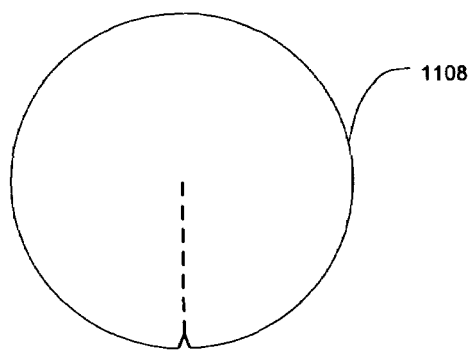

Turning to FIGS. 12A-12C, a front view of a substrate 1200 and resulting plots are shown to illustrate how both angle misalignment and substrate miscut can be determined from a single substrate 1200. The substrate 1200 may be disk shaped. A first quadrant (I) of the substrate 1200 may first be implanted with ions from an ion beam at a plurality of different incident angles. In one instance, the different angles may be effective Y tilt angles as achieved by the drive mechanism 602 illustrated in FIG. 6B. For example, the portion 1202 may correspond to an effective Y tilt angle of −1.0°, portion 1204 to −0.5°, portion 1206 to 0.0°, portion 1208 to +0.5°, and portion 1210 to +1.0°. Differing Y-tilt angles (e.g., $\theta_y$ of FIG. 6B) result in corresponding horizontal incident angles (e.g., $\theta_h$ of FIG. 4). In order to restrict the implant of ions to the first quadrant (I), a shield having an aperture consistent with the quadrant may be utilized upstream of the substrate. The shield or mask may block the ion beam from portions of the substrate while the aperture permits the ion beam to pass. Alternatively, a scan distance of a scanner, e.g., scanner 828 of FIG. 8, as well as a mechanical drive system for driving the substrate may be controlled to only implant ions in the first quadrant (I).

Once the implant of ions in the first quadrant is accomplished, the substrate 1200 may be rotated 180° from its first position so that the second quadrant (II) is now similarly positioned for implant. The ion beam at a similar plurality of incident angles may be implanted into similar portions of the second quadrant (II). For example, the five portions 1212, 1214, 1216, 1218, 1220 may be implanted at the same effective Y tilt angles of −1.0°, −0.5°, 0.0°, +0.5°, and +1.0° as were portions 1202, 1204, 1206, 1208, 1210 of the first quadrant (I).

The substrate 1200 may then be rotated 90° clockwise from its previous position so that the third quadrant (III) is now similarly positioned for implant. The ion beam may be directed at a plurality of different X-tilt angles. For example, five different portions of the third quadrant (III) may be implanted with five different X-tilt angles of −1.0°, −0.5°, 0.0°, +0.5°, and +1.0°. Differing X-tilt angles (e.g., $\theta_x$ of FIG. 6A) result in corresponding vertical incident angles (e.g., $\theta_v$ of FIG. 5).

The substrate 1200 may then be rotated 180° from its previous position so that the fourth quadrant (IV) is now similarly positioned for implant. The ion beam at a similar plurality of X-tilt incident angles as the third quadrant (III) may then be implanted into similar portions of the fourth quadrant (IV).

FIG. 12B illustrates results of measuring angle sensitive data from different portions of the substrate 1200 to determine a substrate miscut angle and also to determine any angle misalignment. The results of FIG. 12B illustrate no angle misalignment, but a substrate miscut. In contrast, the results of FIG. 12C illustrate both an angle misalignment and a substrate miscut. The two plots 1250 and 1252 of FIG. 12B plot damage to the substrate 1200 versus effective Y tilt angles in degrees to illustrate a vertical substrate miscut angle $\theta_y$ in the Y direction. The damage units may by Therma-Wave infinity units obtained using a Therma-Probe®. The plot 1250 corresponds to the measured damage to portions 1202, 1204, 1206, 1208, 1210 of the first quadrant (I) while plot 1252 corresponds to the measured damage to similar portions 1212, 1214, 1216, 1218, 1220 of the third quadrant (III). Since both plots 1250, 1252 are symmetrical about 0.0°, there is no angle misalignment. The plots 1250, 1252 do reveal a vertical substrate miscut angle $\theta_y$ in the Y direction of about 0.25° as illustrated by line 1270.

FIG. 12C, in contrast to FIG. 12B, illustrates both angle misalignment and a vertical substrate miscut angle $\theta_y$. The angle misalignment is about of about 0.5° as illustrated by line 1276. The vertical substrate miscut angle $\theta_y$ is about 0.25° as illustrated by line 1278. Similarly to that illustrated in FIGS. 12B and 12C, the measurements of angle sensitive data for the third (III) and fourth (IV) quadrants can be used to determine any angle misalignment and a horizontal substrate miscut angle $\theta_x$. Once the substrate miscut angles $\theta_x$, $\theta_y$ and/or angle misalignments are determined, offset angles can be set to compensate for the same. For instance, the drive mechanism 602 of FIGS. 6A and 6B may set the substrate to a particular X and Y offset tilt angle home position to compensate.

In another embodiment, substrate miscut may be ascertained using a plurality of substrates. For instance, turning to FIGS. 13A-13D, front views of four substrates 1102, 1104, 1106, 1108 cut from the same cylindrical ingot 1100 and having identical surface orientations may be utilized to determine a substrate miscut angle $\theta_x$ in the X direction and a substrate miscut angle $\theta_y$ in the Y direction. A plurality of portions of the first substrate 1102 may be implanted at different incident angles associated with each of the plurality of portions consistent with earlier described embodiments. The incident angles may be achieved by tilting the substrate, deflecting the ion beam, or some combination of the two. The second, third, and fourth substrates 1104, 1106, 1108 may also be similarly implanted except that each substrate 1104, 1106, 1108 is rotated about the Z axis with respect to the implant position of the first substrate 1102.

The second substrate 1104 is implanted at a rotation position 90° from the implant position of the first substrate 1102. The third substrate 1106 is implanted at a rotation position 180° from the implant position of the first substrate 1102, and finally the fourth substrate 1108 is implanted at a rotation position 270° from the implant position of the first substrate 1102. Phantom line are illustrated in FIGS. 13A-D from the center of each substrate to a notch in each substrate for clarity of illustration to show the different rotation positions of the substrates relative to one another during implant.

The difference between the measured angle sensitive data for the first substrate 1102 and the third substrate 1106 rotated 180° relative to the first substrate 1102 gives the substrate miscut angle $\theta_x$ in the X direction. Meanwhile, the difference between the measured angle sensitive data for the second substrate 1104 rotated 90° from the first substrate 1102 and the fourth substrate rotated 270° from the first substrate 1102 gives the substrate miscut angle $\theta_y$ in the Y direction. Once the substrate miscut angles $\theta_x$, $\theta_y$ are determined, offset angles for each can be set to compensate for the miscut angles. For instance, the drive mechanism 602 of FIGS. 6A and 6B may set the substrate to a particular X and Y offset tilt angles to properly compensate for the miscut angles.

Accordingly, there is provided a method of determining an angle misalignment between a target surface of a substrate and an incident ion beam using one substrate. Hence, additional costs for additional substrates used in a conventional method are saved. Since the same substrate is used, a consistent crystalline structure of the substrate is ensured which leads to consistency when measuring angle sensitive data from that substrate. Furthermore, the method is fast compared to a conventional method utilizing a plurality of substrates since only one substrate needs to be measured for angle sensitive data and only one substrate needs to be implanted. For example, a conventional method using nine substrates may take about 45 minutes to measure angle sensitive data from the nine different substrates compared to only about 5 minutes for a method consistent with the present invention.

There is also provided a method of determining a substrate miscut angle of a substrate. This allows precise control of incident angles. This information can also improve ion implant performance from batch to batch. This information can also be useful in transferring processes between different manufacturing facilities or recipes suited for substrates for different end users in a substrate foundry where several batches of substrates with different crystal orientations may need to be processed for different end users. In one embodiment, both angle misalignment and substrate miscut may be determined from the same substrate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the foregoing description is by way of example only and is not intended as limiting.

What is claimed is:

1. A method comprising:

directing an ion beam at a plurality of differing incident angles with respect to a target surface of a substrate implant ions into a plurality of portions of said substrate, wherein each one of said plurality of differing incident angles is associated with a different one of said plurality of portions;

measuring angle sensitive data from each of said plurality of portions of said substrate;

determining an angle misalignment between said target surface and said ion beam incident on said target surface from said angle sensitive data; and determining a substrate miscut angle in a first direction between a desired crystalline plane and an actual plane of said target surface of said substrate from said angle sensitive data, wherein said determining said substrate miscut angle comprises:

directing said ion beam at a first plurality of differing incident angles to implant ions into a first plurality of portions of said substrate when said substrate is positioned in a first position, wherein each one of said first plurality of differing incident angles is associated with a different one of said first plurality of portions and said first plurality of portions is positioned on at least a portion of a first half of said substrate;

rotating said substrate 180° from said first position to a second position;

directing said ion beam at said first plurality of incident angles to implant ions into a second plurality of portions of said substrate when said substrate is positioned in said second position, wherein each one of said first plurality of differing incident angles is associated with a different one of said second plurality of portions and said second plurality of portions is positioned on at least a portion of a second half of said substrate;

measuring angle sensitive data of said first and second plurality of portions of said substrate; and comparing said angle sensitive data from said first and second plurality of portions to determine said substrate miscut angle.

2. A method comprising:

directing an ion beam at a first plurality of differing horizontal incident angles with respect to a target surface of a substrate having a disk shape to implant ions into associated portions of a first quadrant of a first half of said substrate when said substrate is in a first position;

rotating said substrate 180° from said first position to a second position;

directing said ion beam at said first plurality of differing horizontal incident angles to implant ions into associated portions of a second quadrant of said substrate on a second half of said substrate when said substrate is in said second position;

rotating said substrate 90° from said second position to a third position;

directing said ion beam at a second plurality of differing vertical incident angles to implant ions into associated portions of a third quadrant of said first half of said substrate when said substrate is in said third position;

rotating said substrate 180° from said third position to a fourth position;

directing said ion beam at said second plurality of differing vertical incident angles to implant ions into associated portions of a fourth quadrant of said second half of said substrate when said substrate is in said fourth position;

measuring angle sensitive data from each of said quadrants;

determining an angle misalignment in a horizontal and a vertical direction between said target surface and said ion beam incident on said target surface from said angle sensitive data; and determining a substrate miscut angle in a horizontal and a vertical direction between a desired crystalline plane and an actual plane of said target surface of said substrate from said angle sensitive data.

3. The method of claim 2, wherein said substrate miscut angle in said horizontal and said vertical direction is determined by comparing said angle sensitive data from said first, second, third, and fourth quadrants.

4. The method of claim 2, wherein said substrate has a crystalline structure and wherein said angle sensitive data is representative of damage to said crystalline structure.

* * * * *

UNITED STATES PATENT AND TRADEMARK OFFICE
CERTIFICATE OF CORRECTION

PATENT NO. : 7,642,529 B2  Page 1 of 1
APPLICATION NO. : 11/541373
DATED : January 5, 2010
INVENTOR(S) : Gupta et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 349 days.

Signed and Sealed this

Sixteenth Day of November, 2010

David J. Kappos
*Director of the United States Patent and Trademark Office*